(12) United States Patent
Wronski et al.

(10) Patent No.: US 8,908,450 B1
(45) Date of Patent: Dec. 9, 2014

(54) DOUBLE CAPACITY COMPUTER MEMORY DEVICE

(71) Applicant: I'M Intelligent Memory Limited, Kwai Chung (HK)

(72) Inventors: Thorsten Helmut Wronski, Oberursel (DE); Klaus Julius Schwarz, Frankfurt (DE); Joseph Chun-Kong Chan, Kwai Chung (HK)

(73) Assignee: I'M Intelligent Memory Limited, Kwai Chung (HK)

( * ) Notice: Subject to any disclaimer, the term of this patent is extended or adjusted under 35 U.S.C. 154(b) by 0 days.

(21) Appl. No.: 14/336,797

(22) Filed: Jul. 21, 2014

(51) Int. Cl.
  *G11C 7/22* (2006.01)
  *G11C 11/4076* (2006.01)

(52) U.S. Cl.
  CPC .................. *G11C 11/4076* (2013.01)
  USPC ................. 365/193; 365/51; 365/63

(58) Field of Classification Search
  CPC ....... G11C 7/22; G11C 7/1066; G11C 7/1051
  USPC .............................. 365/193, 51, 63
  See application file for complete search history.

(56) References Cited

U.S. PATENT DOCUMENTS

| | | | |
|---|---|---|---|
| 4,797,850 A | 1/1989 | Amitai | |
| 6,078,514 A * | 6/2000 | Takemae et al. | 365/63 |
| 6,476,474 B1 | 11/2002 | Hung | |
| 6,826,067 B2 | 11/2004 | Yang | |
| 6,937,494 B2 | 8/2005 | Funaba et al. | |
| 7,434,018 B2 | 10/2008 | Oh et al. | |
| 7,466,577 B2 | 12/2008 | Sekiguchi et al. | |
| 7,546,506 B2 | 6/2009 | Sonoda et al. | |
| 7,638,869 B2 * | 12/2009 | Irsigler et al. | 257/686 |
| 7,698,470 B2 * | 4/2010 | Ruckerbauer et al. | 710/14 |
| 7,746,719 B2 | 6/2010 | Kang | |
| 7,869,243 B2 | 1/2011 | Bacha | |
| 8,120,958 B2 | 2/2012 | Bilger et al. | |
| 8,350,865 B2 | 1/2013 | Schoner et al. | |
| 8,416,639 B2 | 4/2013 | Kang | |
| 8,446,781 B1 | 5/2013 | Rajan et al. | |
| 8,619,452 B2 | 12/2013 | Rajan et al. | |
| 8,619,481 B2 | 12/2013 | Jeddeloh et al. | |
| 2009/0027940 A1 | 1/2009 | Backa | |
| 2010/0140583 A1 | 6/2010 | Chen | |
| 2013/0021866 A1 | 1/2013 | Lee | |

OTHER PUBLICATIONS

Hynix Semiconductor, "4Gb DDR3 SDRAM DDP(2Gbx2)" http://www.skhynix.com/inc/pdfDownload.jsp?path=/datasheet/pdf/dram/H5TQ4G(48)3MMR(Rev0.1).pdf, pp. 1-73 (Aug. 2008).

(Continued)

*Primary Examiner* — Son Dinh
(74) *Attorney, Agent, or Firm* — Kagan Binder, PLLC

(57) ABSTRACT

A double density memory device including two synchronous dynamic random access memory chips, each having multiple data (DQ) signals, multiple address signals and multiple control signals. The chips are mounted in a package that provides interconnection terminals for conducting electrical signals to and from the memory chips. An interconnecting network is contained within the package to provide paths for electrically connecting the chip contact pad on each chip corresponding to a specific control or address signal to one interconnection terminal for that signal for both chips so that the control and address signals for the two chips are tied together. For each DQ signal, the chip contact pad on each chip corresponding to that DQ signal is connected by the interconnecting network to a separate interconnection terminal. The trace length between a chip contact pad and the interconnection terminal to which it connects for each signal is substantially the same.

18 Claims, 3 Drawing Sheets

(56) References Cited

OTHER PUBLICATIONS

Samsung Electronics, "DDP 8Gb B-die DDR3 SDRAM" http://www.samsung.com/global/business/semiconductor/file/product/ds_k4b8g1646b_1_35v_rev10-0.pdf. pp. 1-62, (Feb. 2013).

Malladi et al., "Towards Energy-Proportional Datacenter Memory with Mobile DRAM" http://csl.stanford.edu/~christos/publications/2012.lpddr2.isca.pdf, pp. 1-12 (2012).

SK Hynix "DDR4 SDRAM Registered DIMM Based on 4Gb M-die" http://www.skhynix.com/inc/pdfDownload.jsp~path=/datasheet/pdf/module/computing_ds_4Gb_DDR4(M-ver)based_RDIMMs(Rev.0.01).pdf, pp. 1-60 (Jun. 2013).

Micron Technology, Inc., "DDR4 SDRAM UDIMM" https://www.google.co.in./url?sa=t&rct=j&q=&esrc=s&source=web&cd=1&cad=rja&uact=8&ved=0CCkQFjAA&url=http%3A%2F%2Fwww.micron.com%2F-%2Fmedia%2FDocuments%2FProducts%2FData%2520Sheet-%2FModules%2FUnbuffered_DIMM%2Fatf16c1gx64az.pdf&ei=YGFGU6HoL8eHrQevtYG4Cw&usg=AFQjCNEUIU4NebQvEIw2cverRWEQHbT3_w&sig2=WcXAhBX4WT2JEF7Tklfmxg&bvm=bv.64507335,d.bmk, pp. 1-18 (2013).

\* cited by examiner

US 8,908,450 B1

DOUBLE CAPACITY COMPUTER MEMORY DEVICE

FIELD OF THE INVENTION

The present invention relates generally to a computer memory device, and more particularly to a double stacked memory device have two memory chips in one package.

BACKGROUND OF THE INVENTION

Dynamic Random Access Memory (DRAM) is widely used in computers and other electronic devices for storing and retrieving digital data. Many such memory devices are JEDEC DDR3-compliant, and others will be JEDEC DDR4-compliant. DDR is an abbreviation for double data rate, which refers to effecting transfers on both the rising and falling edges of the clock signal in order to double the data transfer rate relative to the clock rate. JEDEC is an abbreviation for the Joint Electron Device Engineering Council, which is an independent semiconductor engineering trade organization and standardization body. The JEDEC DDR3 standard is widely followed, as were the earlier DDR1 and DDR2 standards, and the same is expected for the DDR4 and future JEDEC standards. The DDR3 standard permits DRAM chip capacities of up to 8 Gbit (or gigabit, where a Gbit is 1,073,741,824 bits, being two raised to the power of 30, or about one billion).

A DDR3 synchronous DRAM (SDRAM) module includes a number of DDR3 compliant SDRAM chips, which may alternatively be referred to as "dice" or "dies". Typically, each chip is enclosed in its own ball grid array (BGA) surface-mount package (or fine-pitch ball grid array (FBGA) package), such as an FBGA 78 package (having 78 balls) or an FBGA 96 package (having 96 balls).

In order to achieve higher density, some existing DDR memory devices stack two chips in a single package. However, in such prior art designs, these two chips operate as if they were packaged separately, having separate control lines for each die that are separately connected to the balls of the BGA package. The assembled memory device is then accessible by a processor as if there were two separate components on the board, although both are inside one package.

In DDR3 technology, the memory is activated and selected by four control pins. These contacts are named Chip Select (CS), Clock Enable (CKE), On-Die Termination (ODT) and ZQ calibration (ZQ). CS, CKE and ODT are connected from the memory chip to the CPU. ZQ is connected to ground through a serial resistor. A monolithic memory chip only has one set of these control lines. In the prior art stacked-chip devices however, two sets of control lines are required. They may be called CS0 and CS1, CKE0 and CKE1, ZQ0 and ZQ1, ODT0 and ODT1 as shown in FIG. 1.

Application designers who elect to use such prior art dual die, dual chip select DDR3 components in their products must prepare their board layouts by routing the additional control pins from every DRAM chip to the processor. In practice, such stacked chip components are rarely utilized because the special design requirements make the use of normal single chip select monolithic DRAMs as an alternate assembly more difficult. Yet another issue is that processors often lack the required number of DRAM control lines to connect such stacked chips, rendering it impossible to access further memory ranks.

SUMMARY OF THE INVENTION

The following presents a simplified summary of the disclosure in order to provide a basic understanding to the reader. This summary is not an extensive overview of the disclosure and it does not necessarily identify key/critical elements of the invention or delineate the scope of the invention. Its sole purpose is to present some concepts disclosed herein in a simplified form as a prelude to the more detailed description that is presented later.

The present invention provides a memory device that includes two synchronous dynamic random access memory chips. Each chip has a first surface with a plurality of chip contact pads. Each contact pad corresponds to one signal of the chip. The chip signals include, for each chip, (i) multiple (e.g. four or eight) data (DQ) signals, (ii) multiple address signals (e.g. 16), and (iii) multiple control signals. The chips are mounted in a package that provides interconnection terminals for conducting electrical signals to and from the memory chips. An interconnecting network is also contained within the package to provide multiple conductive paths for electrically connecting the chip contact pad on each chip corresponding to a specific control or address signal to one interconnection terminal for that signal for both chips so that the control and address signals for the two chips are tied together. For each DQ signal, the chip contact pad on each chip corresponding to that DQ signal is connected by the interconnecting network to a separate interconnection terminal, so that half of the interconnection terminals connected to data signals connect to one of the chips and the other half of the interconnection terminals connected to data signals connect to the other chip. The trace length between a chip contact pad and the interconnection terminal to which it connects is referred to as the trace length for that signal. The interconnecting network is configured so that the trace length for each chip signal is substantially the same.

The interconnecting network may include an interconnecting substrate that has first and second surfaces. The interconnecting substrate may then defines a plurality of substrate conductive paths. Each substrate conductive path electrically connects either one or two substrate contacts on the first surface of the interconnecting substrate to one interconnection terminal of the package proximate to the second surface of the interconnecting substrate. The interconnecting network may then also include a plurality of bonding wires, each bonding wire corresponding to one chip signal of one of the chips and so that the bonding wire for a particular signal on a particular chip connects the chip contact pad for that signal on that chip to one substrate contact.

The lengths of the bonding wires may differ, but the conducting paths in the interconnecting substrate are configured to have lengths to compensate for all such differences in the bonding wire lengths so that the trace lengths of all the chip signals are substantially the same.

The package may be a ball grid array (BGA) package and the interconnection terminals then are balls on the bottom of the package.

It is preferred that the trace lengths for the chip signals do not differ from the average of these lengths by more than ten percent. More preferably, the trace lengths for the chip signals do not differ from the average of these lengths by more than five percent.

The control signals may include a data strobe signal (DQS), a data strobe complement signal (/DQS) and a data mask signal (DM), and the trace lengths for the DQS, /DQS, DM and DQ signals are preferably configured to that they do not differ from the average of these lengths by more than five percent. More preferably, the trace lengths for the DQS, /DQS, DM and DQ signals do not differ from the average of these lengths by more than three percent.

The control signals may also include (a) a clock signal (CK) and a clock signal complement (/CK), such that the trace lengths for the CK and /CK signals do not differ from the average of these lengths by more than five percent, (b) a clock enable signal (CKE), a chip select signal (/CS) and an on die termination signal (ODT), such that the trace lengths for the CKE, /CS and ODT signals do not differ from the average of these lengths by more than ten percent, and (c) bank address signals (BA0-BA2), a row address strobe signal (/RAS), a column access strobe signal (/CAS), a write enable signal (/WE), and there are sixteen address signals (A0-A15), wherein the trace lengths for the address, bank address, /RAS, /CAS and /WE signals do not differ from the average of these lengths by more than ten percent. More preferably, the trace lengths for the DQS, /DQS, DM and DQ signals do not differ from the average of these lengths by more than three percent, the trace lengths for the CK and /CK signals do not differ from the average of these lengths by more than three percent, the trace lengths for the CKE, ICS and ODT signals do not differ from the average of thehe lengths by more than five percent, and the trace lengths for the address, bank address, /RAS, /CAS and /WE signals do not differ from the average of these lengths by more than five percent.

The control signals may also include bank group signals (BG0 and BG1), chip ID signals (C0-C2), an activate signal (/ACT) and a parity signal (PAR), such that the trace lengths for the address, bank address, bank group, chip ID, /RAS, /CAS, /WE, /ACT and PAR signals do not differ from the average of these lengths by more than ten percent, or more preferably do not differ from the average of these lengths by more than five percent.

Each chip may have four DQ signals so that the memory device has an eight bit width.

The memory device may be JEDEC DDR3-compliant other than in respect of the 110 capacitance specifications, and the package may be a JEDEC-compliant DRAM package.

The memory device may be JEDEC DDR4-compliant other than in respect of the I/O capacitance specifications, and the package may be a JEDEC-compliant DRAM package.

Each memory chip may have a capacity of 2 Gbits so that the device capacity is 4 Gbits. The memory device may have a capacity of 4 Gbits so that the device capacity is 8 Gbits. Each memory chip may have a capacity of 8 Gbits so that the device capacity is 16 Gbits.

Preferably, each of the two chips is from the same production lot, and more preferably from the same wafer.

DETAILED DESCRIPTION OF THE INVENTION

In this description, signals that are active-low are denoted by prefixing them with a slash character, "/". For example /DQS is an active-low data strobe signal, which may also be referred to as a data strobe complement signal. In contrast, DQS is an active-high data strobe signal. Alternative ways of representing an active-low data strobe signal include DQS#, \DQS, DQSB and DQS with a horizontal bar above the letters. For simplicity, where a signal is only an active-low signal, it may be referred to without specifically indicating that it is active-low (e.g. /CS may be referred to as the "chip select" signal since there is no active-high chip select signal).

Figure 3:
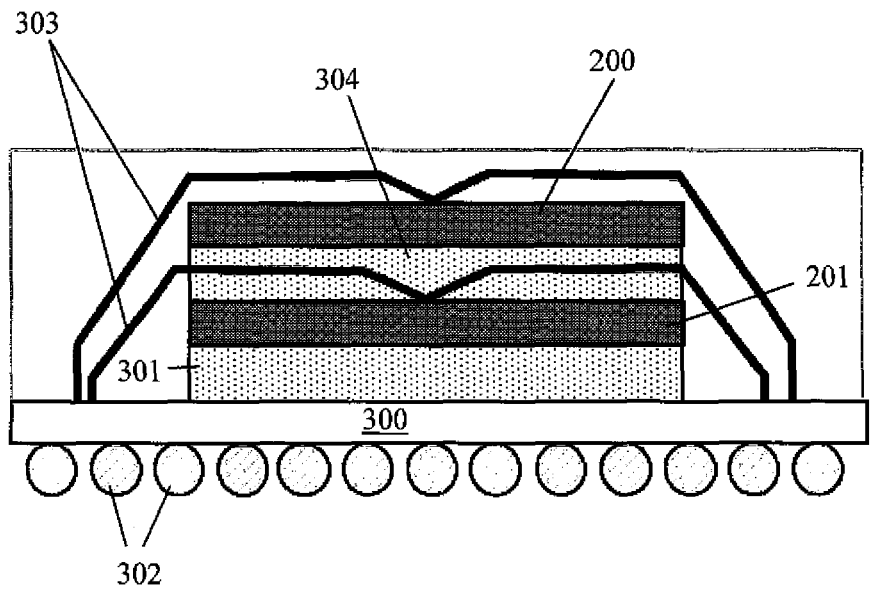
FIG. 3 shows a dual chip memory device using a BGA package.
Figure 4:
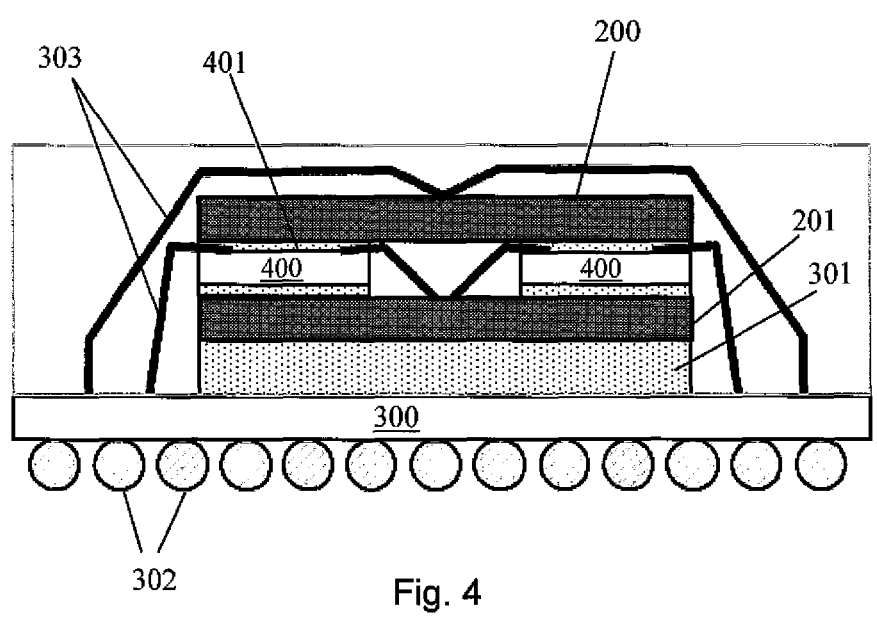
FIG. 4 shows another embodiment of a dual chip memory device using a BGA package.

The present invention provides a memory device including two SDRAM chips (or dice) where the two chips are stacked one on top of the other, both being face up, as depicted in FIGS. 3 and 4 where chip 200 is above chip 201. FIG. 3 shows an interconnecting substrate 300 where the lower surface of the interconnecting substrate 300 has interconnection terminals, which are balls 302, mounted on it. The interconnecting substrate 300 preferably consists of a multi-layer printed circuit board (PCB) that has a lower layer with electrically conductive metal traces terminating at interconnection terminals 302 on the lower surface of the interconnecting substrate 300. In the depicted embodiments, the interconnection terminals are the balls 302 of a BGA package. The interconnecting substrate 300 may have one or more insulating layers, and has an upper layer with electrically conductive metal traces terminating at substrate contacts on the upper surface of the interconnecting substrate 300 for purposes of connecting to the chip signal lines. There may be additional layers with conductive metal traces, such layers being separated from each other by insulating layers.

The traces in the interconnecting substrate 300 are routed through the layers, and connected between layers as required, to electrically connect each substrate contact to one interconnection terminal. In some cases, as described below, a substrate contact connects to an interconnection terminal that no other substrate contact connects to and in other cases two substrate contacts connect to the same interconnection terminal thereby tying the signals connected to the two substrate contacts together.

DDR3 memory employs four key sets of chip signals, which are shown in the table below with arbitrary set numbers assigned to each set. The DDR3 standard includes additional control/power signals (such as VDDQ, VSSQ, VREFDQ, VREFCA, /RESET), which are handled in the present memory device in the same manner as the other control signals. Control signals may alternatively be referred to as command signals.

| Set no. | DDR3 Signal Abbreviation | DDR3 Signal name | Signal type | Item no. in FIGS. |
|---|---|---|---|---|
| 1 | DQ0-DQ7 | Data bits 0-7 | Input/output data | 207 & 208 |
|  | DQS | Data Strobe | Input/output control | 206 |
|  | /DQS | Data Strobe complement | Input/output control |  |
|  | DM | Data Mask | Input control |  |
| 2 | CK | Clock | Input control | 205 |
|  | /CK | Clock complement |  |  |
| 3 | /CS | Chip Select | Input control | 202 |
|  | CKE | Clock Enable |  |  |
|  | ODT | On Die Termination |  |  |
| 4 | A0-A15 | Address signals 0-15 | Input address | 204 |
|  | BA0-BA2 | Bank Address signals 0-2 |  |  |
|  | /RAS | Row Address Strobe | Input control | 203 |
|  | /CAS | Column Address Strobe |  |  |
|  | /WE | Writ Enable |  |  |

Figure 2:
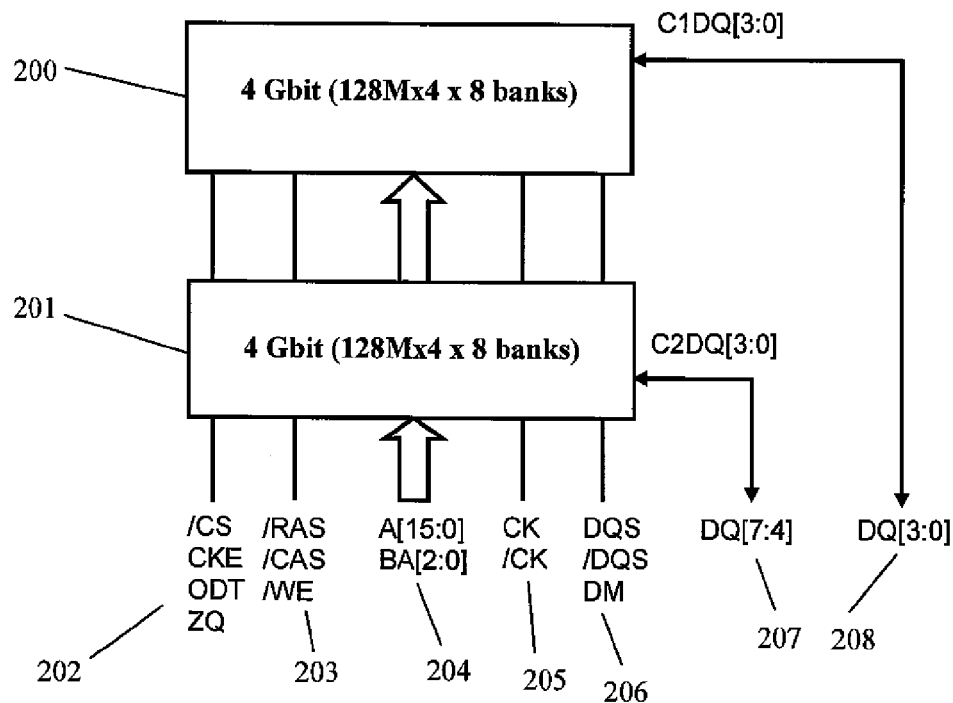
FIG. 2 shows the design of a dual chip memory device with two 4 Gbit stacked chips where the same set of control lines controls both chips. Only key chip signals are shown.
Figure 5:
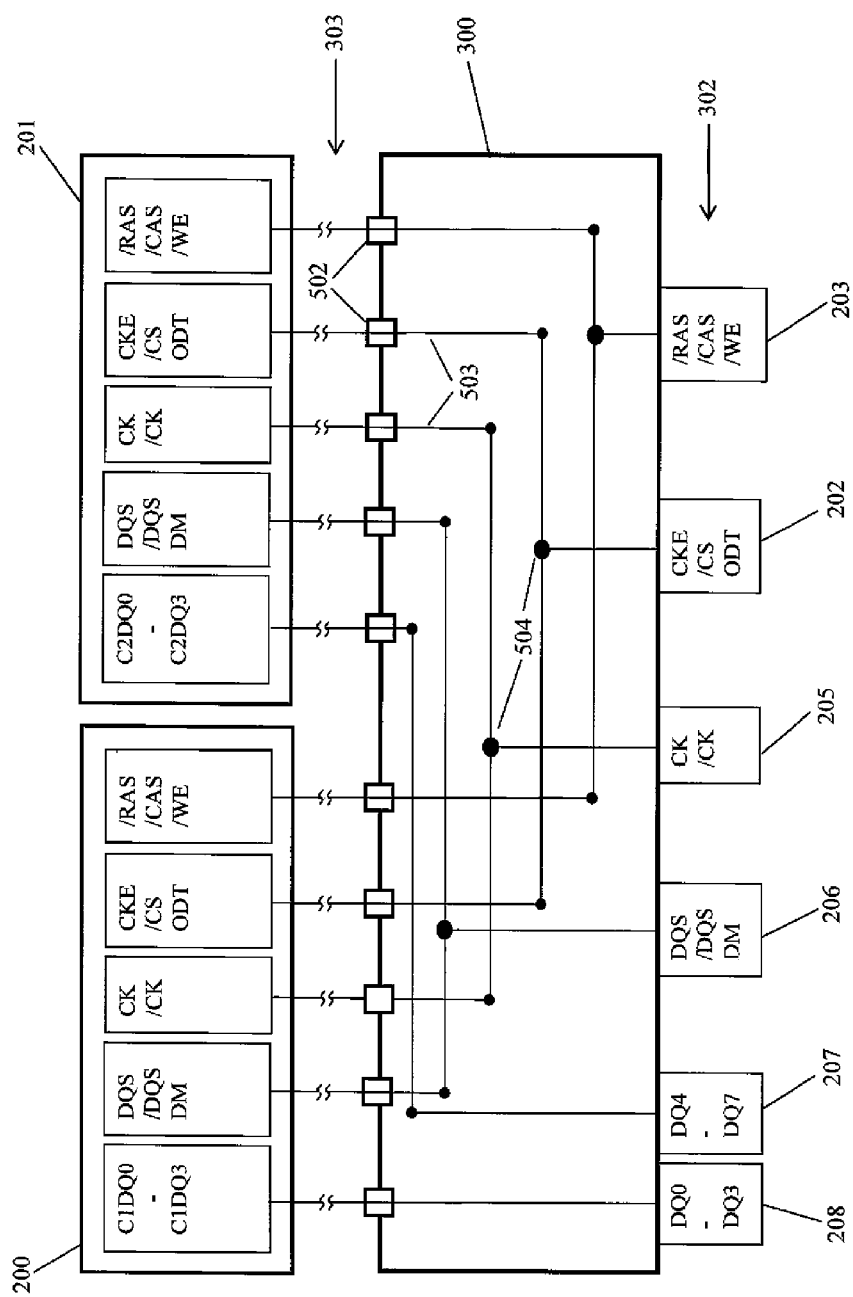
FIG. 5 is a diagram of the memory device showing the connections of key chip signals, other than address signals.

These signals are depicted in FIG. 2 and, other than the address signals, in FIG. 5.

The overall design is depicted in FIG. 2, which shows two memory chips 200, 201 each with 4 Gbit capacity, organized as 128M×4×8 (where "128M" means two to the power of 27, and M means two to the power of 20, or 1,048,576, which is about one million). Although the same numbers (200, 201) are used in the other figures, this is not intended to limit the capacities of the depicted chips in the other figures to 4 Gbit, which is just shown as an example in FIG. 2.

In this device, all the control and address signals are connected so that the same signals on each chip are tied together and connected to the same external interconnection terminal, such as a ball on a BGA package. For example, /CS for chip 200 and /CS for chip 201 are both connected to the same external interconnection terminal, so a processor connected to the memory device uses only a single ICS signal for the memory device, and that same /CS signal is propagated to both chips 200, 201 inside the memory device in a manner that is invisible to the processor. However, the data signals are connected differently. Each of the two chips 200, 201 has four data signals, DQ0-DQ3 in this example embodiment. These are referred to as C1DQ0-C1DQ3 for chip 200 and as C2DQ0-C2DQ3 for chip 201 for clarity. Each of these data signals is connected to a separate interconnection terminal so that C1DQ0-C1DQ3 are connected to four device interconnection terminals DQ0-DQ3, and C1DQ4-C1DQ7 are connected td another four device interconnection terminals DQ4-DQ7. In this way, there are eight interconnection terminals corresponding to DQ0-DQ7 for the memory device that can be read and written by a processor. The processor sees only one usual set of DDR3 control and address signals, and reads or writes eight bits of data at a time, exactly as it would with a single chip, "monolithic", DDR3 8-bit device where the monolithic chip has twice the capacity of each of the chips 200, 201 in the present design. 8-bit memory devices, such as that shown in FIG. 2, may be packaged in a standard JEDEC FBGA 78 package.

Figure 1:
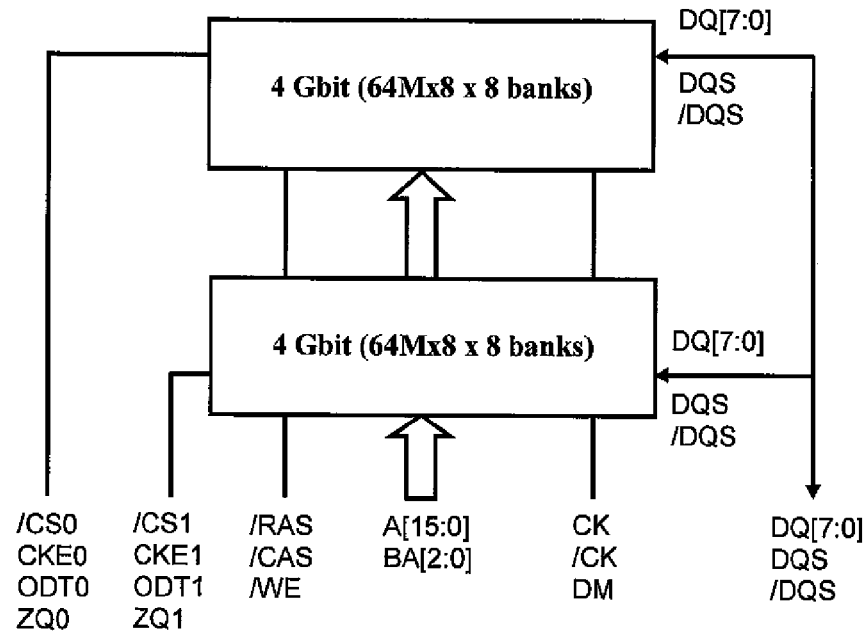
FIG. 1 shows a prior art memory device with two 4 Gbit stacked chips where each chip is controlled by a separate set of CS, CKE, ODT and ZQ signals.

FIG. 1 shows a typical prior art stacked chip memory device. As shown in FIG. 1, the device presents separate control signals to a processor that it must separately control, such as separate ICS, CKE and ODT signals. All eight data bits of a data transfer are then obtained from or saved to one or the other of the two chips.

In the present memory device design, signal integrity is crucial so that the design uses a dual die face up structure, as shown in two example embodiments in FIGS. 3 and 4. In both variants, the lower chip 201 is attached to the interconnecting substrate 300 via a bonding layer 301, which may be epoxy.

In the preferred embodiment shown in FIG. 3, a second bonding layer 304 between the lower chip 201 and the upper chip 200 bonds the chips together and provides a medium for bonding wires 303 to pass through so that one end of each binding wire 303 can connect to one chip contact pad on the upper surface of the lower chip 201, and the other end to one substrate contact on the upper surface of the interconnecting substrate 300, thus forming a conductive path from the chip contact pad to the substrate contact. Similarly the chip contact pads of the upper chip 200 are connected to other substrate contacts on the upper surface of the interconnecting substrate 300 by bonding wires 303. The bonding wires may be made from any suitable material, typically a metal such as gold, aluminum or copper.

FIG. 4 depicts a similar design except that the chips 200, 201 are separated by interposers 400, which are bound to each of the chips by lower and upper boding layers 401, which may be epoxy.

A key issue is that it is important to have the signal trace lengths for each corresponding signal of each die be approximately equal so that there is no difference in length between the corresponding signal traces and between all the traces. Ideally they are of identical length, but it is sufficient for proper functioning of the device that they be substantially the same length, as will be quantified below. The lengths of the bonding wires necessarily vary, which means that the signal propagation time through those wires will differ. In general, however, for the memory device to function properly the length of the conductive path, referred to as the "trace length" between the chip contact pad and the interconnection terminal to which it connects must be substantially the same for all signals so that the signal propagation times for all signals are substantially the same. In general, this means that the trace length (and therefore signal propagation times) for any signal should not differ by more than about 10% from the average trace length, and it is preferred that it does not differ by more than 5%.

For example, if the average trace length for a set of signals is 1000 um, then a requirement of 10% or less means roughly that the actual trace length of each signal in the set should be between 900 um and 1100 um.

This is particularly important for the corresponding signals of the two chips (so for example the trace length for the DQS signal for the first chip 200 and the trace length for the DQS signal for the second chip 201 must be substantially the same length). It is preferred that each of these differ from the average of the lengths by less than 5%, and more preferably differ by less than 3%, and even more preferably differ by less than 1%.

It is also particularly important for each signal in the same signal set, as described above for each of the four sets of key signals, that they have trace lengths that do not differ substantially from each other, or equivalently they have trace lengths that do not differ substantially from the average of the lengths of the traces for signals in the set. Within each set, it is preferred that the associated trace lengths differ from the average length of traces in that set by less than 5%, and more preferably by less than 3%.

The required timing precision is obtained by the configuration of the interconnecting substrate 300. This is depicted conceptually in FIG. 5. Although FIG. 5 shows the bonding wires 303 all being the same length, this is not the case, as they vary significantly between and within each chip so that the conductive path lengths between the chip contact pads and the substrate contacts 502 vary significantly (e.g. by more than 10% from the average length). However, the substrate conductive paths 503 inside the interconnecting substrate 300 are configured to compensate for the variations in the bonding wire lengths. This is achieved by arbitrarily increasing the lengths of some conductive paths (relative to straight or minimal length paths) by configuring the traces in the interconnecting substrate 300 to meander or "snake", so that they can be made substantially longer than a straight trace.

For the control signals and the address signals (the address signals are not shown in FIG. 5), the corresponding signals from each chip connect to different substrate contacts 502, but inside the interconnecting substrate 300 the conductive paths connected to those substrate contacts are joined together at points shown with a black circle 504. Note that the lines inside the interconnecting substrate 300 in FIG. 5 are not connected where they intersect except as indicated by these circles 504. Note also that the traces 503 inside the interconnecting substrate 300 are depicted as being composed of straight segments. This is done only to show the connections. In fact, as discussed, some of the paths may be wavy or snaked in order to adjust the length of the associated trace.

The combined control or address signal then connects to its own interconnection terminal on the bottom surface of the interconnecting substrate 300. Note that for space reasons, the interconnection terminals at the bottom of FIG. 5 are grouped in sets. In reality, each of the named signals at the bottom of FIG. 5 represents a different interconnection terminal (or ball or pin). The DQ signals from each chip are routed directly to interconnection terminals though the interconnecting substrate 300 so that C1DQ0-C1DQ3 are connected directly to DQ0-DQ3 respectively, and C2DQ0-C2DQ3 are connected directly to DQ4-DQ7 respectively. As with the control paths though, the conductive path lengths for the DQ signals in the interconnecting substrate 300 are configured so that the total trace length for each signal is substantially the same, as discussed above.

Power is supplied symmetrically to both dice using all VSSQ/VDDQ connection for the JEDEC ball matrix to minimize power drop effect, This is important because the two dice must behave very similarly even when non-symmetric data patterns are applied (such as all DQ for the upper die being 1 and all DQ for the lower die being 0).

In order to avoid timing differences resulting from manufacturing deviations between the two dice used in a device, it is preferred that two dice from one wafer or at least from same production lot are used in each memory device.

The same approach can be directly adapted for use with DDR4, and for related standards or specifications. DDR4 has additional control signals, such as bank group signals (SG0-BG1), chip ID signals (C0-C2), an activate signal (/ACT) and a parity signal (PAR). These signals can be considered to be part of set corresponding to set 4 as defined above, which for DDR4 includes the address, bank address, bank group, chip ID, /RAS, /CAS, /WE, /ACT and PAR signals. The interconnecting substrate 300 is configured to ensure that the trace lengths of these signals do not differ from the average length by more than 10%, and preferably so that they do not differ by more than 5%. Other additional DDR4 signals include /Alert. The standard /RAS, /CAS and /WE signals are shared with high-order address bits that are not used when /ACT is high (all are in set 4 as described above).

With DDR4, the resulting dual die memory devices can include, for example, 4 Gbit, 8 Gbit and 16 Gbit devices. A 4 Gbit device can be made with 512M×8 bit organization using two 2 Gbit DDR4 chips, each being a 512M×4 bit device. This employs address lines A0-A14.

An 8 Gbit device can be made with 1 G×8 bit organization using two 4 Gbit DDR4 chips, each being a 1G×4 bit device. This employs address lines A0-A15.

A 16 Gbit device can be made with 2G×8 bit organization using two 8 Gbit DDR4 chips, each being a 2G×4 bit device. This employs address lines A0-A16.

Using the approach described above, a double capacity memory device can be produced that has twice the capacity of the two chips from which it is built, and which is fully JEDEC-compliant (e.g. DDR3 or DDR4 compliant) except for I/O capacitance. Because of the dual die design, the memory device may not meet the JEDEC specification for I/O capacitance.

Although the above description has focused on embodiments employing two chips and which are JEDEC-complaint, it will be clear to skilled persons that the invention is not so limited. For example, devices with more than two chips may employ the same design approach (so, for example, four 4-bit memory chips may be used to create a 16-bit device.

Generally, a computer, computer system, computing device, client or server, as will be well understood by a person skilled in the art, includes one or more than one computer processor, and may include separate memory, and one or more input and/or output (I/O) devices (or peripherals) that are in electronic communication with the one or more processor(s). The electronic communication may be facilitated by, for example, one or more busses, or other wired or wireless connections. In the case of multiple processors, the processors may be tightly coupled, e.g. by high-speed busses, or loosely coupled, e.g. by being connected by a wide-area network.

A computer processor, or just "processor", is a hardware device for performing digital computations. A programmable processor is adapted to execute software, which is typically stored in a computer-readable memory. Processors are generally semiconductor based microprocessors, in the form of microchips or chip sets. Processors may alternatively be completely implemented in hardware, with hard-wired functionality, or in a hybrid device, such as field-programmable gate arrays or programmable logic arrays. Processors may be general-purpose or special-purpose off-the-shelf commercial products, or customized application-specific integrated circuits (ASICs).

A processor includes one or more than one arithmetic logic unit that performs arithmetic operations on digital data. The digital data may represent, inter alia, numbers, for example in fixed point or floating point formats, or text or other non-numeric entities though a coding scheme such as the ASCII code.

It should be understood that the above-described embodiments of the present invention, particularly, any "preferred" embodiments, are only examples of implementations, merely set forth for a clear understanding of the principles of the invention. Many variations and modifications may be made to the above-described embodiment(s) of the invention as will be evident to those skilled in the art.

Where, in this document, a list of one or more items is prefaced by the expression "such as" or "including", is followed by the abbreviation "etc.", or is prefaced or followed by the expression "for example", or "e.g.", this is done to expressly convey and emphasize that the list is not exhaustive, irrespective of the length of the list. The absence of such an expression, or another similar expression, is in no way intended to imply that a list is exhaustive. Unless otherwise expressly stated or clearly implied, such lists shall be read to include all comparable or equivalent variations of the listed item(s), and alternatives to the item(s), in the list that a skilled person would understand would be suitable for the purpose that the one or more items are listed.

Where, in this document, including the claims, the conjunction "or" is used in a list, such as in "w is done by performing x, performing y or by performing z", unless otherwise clearly implied, the "or" is non-exclusive. In this example, w may therefore be done by performing all of x, y and z, performing any two of x, y and z, or performing any one of x, y and z, unless the simultaneous performance is not possible or does not make sense.

The words "comprises" and "comprising", when used in this specification and the claims, are to used to specify the presence of stated features, elements, integers, steps or components, and do not preclude, nor imply the necessity for, the presence or addition of one or more other features, elements, integers, steps, components or groups thereof.

The scope of the claims that follow is not limited by the embodiments set forth in the description. The claims should be given the broadest purposive construction consistent with the description as a whole.

What is claimed is:

1. A memory device comprising:
   (a) two synchronous dynamic random access memory chips, each chip having a first surface comprising a plurality of chip contact pads, each contact pad corresponding to one signal of the chip, the chip signals including, for each chip, (i) a plurality of data (DQ) signals, (ii) a plurality of address signals, and (iii) a plurality of control signals;
   (b) a package for mounting the memory chips having interconnection terminals for conducting electrical signals to and from the memory chips;
   (c) an interconnecting network disposed within the package providing a plurality of conductive paths for electrically connecting (i) for each control signal and for each address signal, the chip contact pad on each chip corresponding to that control or address signal to one interconnection terminal for that signal for both chips so that the control and address signals for the two chips are tied together, and (ii) for each DQ signal, the chip contact pad on each chip corresponding to that DQ signal to a separate interconnection terminal so that half of the interconnection terminals connected to data signals connect to one of the chips and the other half of the interconnection terminals connected to data signals connect to the other chip,
   wherein each chip signal has a trace length between the chip contact pad and the interconnection terminal to which it connects, and the interconnecting network is configured so that the trace length for each chip signal is substantially the same.

2. The memory device of claim 1, wherein the interconnecting network comprises:
   (a) an interconnecting substrate having first and second surfaces, the interconnecting substrate defining a plurality of substrate conductive paths, each substrate conductive path electrically connecting either one or two substrate contacts on the first surface of the interconnecting substrate to one interconnection terminal of the package proximate to the second surface of the interconnecting substrate;
   (b) a plurality of bonding wires, each bonding wire corresponding to one chip signal of one of the chips and connecting the chip contact pad for that signal on that chip to one substrate contact.

3. The memory device of claim 2, wherein the lengths of the bonding wires differ, and the conducting paths in the interconnecting substrate are configured to have lengths to compensate for the differences in the bonding wire lengths so that the trace lengths of all the chip signals are substantially the same.

4. The memory device of claim 1, wherein the package is a ball grid array package and the interconnection terminals are balls on the bottom of the package.

5. The memory device of claim 1, wherein the trace lengths for the chip signals do not differ from the average of these lengths by more than ten percent.

6. The memory device of claim 5, wherein the trace lengths for the chip signals do not differ from the average of these lengths by more than five percent.

7. The memory device of claim 1, wherein the control signals include a data strobe signal (DQS), a data strobe complement signal (/DQS) and a data mask signal (DM), and wherein the trace lengths for the DQS, /DQS, DM and DQ signals do not differ from the average of these lengths by more than five percent.

8. The memory device of claim 7, wherein the trace lengths for the DQS, /DQS, DM and DQ signals do not differ from the average of these lengths by more than three percent.

9. The memory device of claim 7, wherein:
   (a) the control signals include a clock signal (CK) and a clock signal complement (/CK), wherein the trace lengths for the CK and /CK signals do not differ from the average of these lengths by more than five percent;
   (b) the control signals include a clock enable signal (CKE), a chip select signal (ICS) and an on die termination signal (ODT), wherein the trace lengths for the CKE, /CS and ODT signals do not differ from the average of these lengths by more than ten percent; and
   (c) the control signals include bank address signals (BA0-BA2), a row address strobe signal (/RAS), a column access strobe signal (/CAS), a write enable signal (/WE), and there are sixteen address signals (A0-A15), wherein the trace lengths for the address, bank address, /RAS, /CAS and /WE signals do not differ from the average of these lengths by more than ten percent.

10. The memory device of claim 9, wherein:
    (a) the trace lengths for the DQS, /DQS, DM and DQ signals do not differ from the average of these lengths by more than three percent;
    (b) the trace lengths for the CK and /CK signals do not differ from the average of these lengths by more than three percent;
    (c) the trace lengths for the CKE, /CS and ODT signals do not differ from the average of these lengths by more than five percent; and
    (d) the trace lengths for the address, bank address, /RAS, /CAS and /WE signals do not differ from the average of these lengths by more than five percent.

11. The memory device of claim 9, wherein the control signals include bank group signals (BG0 and BG1), chip ID signals (C0-C2), an activate signal (/ACT) and a parity signal (PAR), wherein the trace lengths for the address, bank address, bank group, chip ID, /RAS, /CAS, /WE, /ACT and PAR signals do not differ from the average of these lengths by more than ten percent.

12. The memory device of claim 10, wherein the control signals include bank group signals (BG0 and BG1), chip ID signals (C0-C2), an activate signal (/ACT) and a parity signal (PAR), wherein the trace lengths for the address, bank address, bank group, chip ID, /RAS, /CAS, /WE, /ACT and PAR signals do not differ from the average of these lengths by more than five percent.

13. The memory device of claim 1, wherein each chip has four DQ signals so that the memory device has an eight bit width.

14. The memory device of claim 13, wherein the memory device is JEDEC DDR3-compliant other than in respect of the I/O capacitance specifications, and the package is a JEDEC-compliant DRAM package.

15. The memory device of claim 13, wherein the memory device is JEDEC DDR4-compliant other than in respect of the 110 capacitance specifications, and the package is a JEDEC-compliant DRAM package.

16. The memory device of claim 15, wherein each memory chip has a capacity of 2 Gbits so that the device capacity is 4 Gbits.

17. The memory device of claim 14, wherein each memory chip has a capacity of 4 Gbits so that the device capacity is 8 Gbits.

18. The memory device of claim 15, wherein each memory chip has a capacity of 4 Gbits so that the device capacity is 8 Gbits.

* * * * *

UNITED STATES PATENT AND TRADEMARK OFFICE
CERTIFICATE OF CORRECTION

| | | |
|---|---|---|
| PATENT NO. | : 8,908,450 B1 | Page 1 of 1 |
| APPLICATION NO. | : 14/336797 | |
| DATED | : December 9, 2014 | |
| INVENTOR(S) | : Wronski et al. | |

It is certified that error appears in the above-identified patent and that said Letters Patent is hereby corrected as shown below:

In the Claims

<u>Claim 9,</u>
Column 10, line 13, delete "(ICS)" and insert --(/CS)--, therefor.

<u>Claim 15,</u>
Column 10, line 60, delete "110" and insert --I/O--, therefor.

Signed and Sealed this
Fourteenth Day of April, 2015

Michelle K. Lee
*Director of the United States Patent and Trademark Office*